(12) United States Patent
Tarantino

(10) Patent No.: US 10,015,886 B2
(45) Date of Patent: Jul. 3, 2018

(54) METHOD FOR PRODUCING PORTABLE DATA CARRIERS

(71) Applicant: GIESECKE & DEVRIENT GMBH, Munich (DE)

(72) Inventor: Thomas Tarantino, Laufen (DE)

(73) Assignee: GIESECKE+DEVRIENT MOBILE SECURITY GMBH, Munich (DE)

( * ) Notice: Subject to any disclaimer, the term of this patent is extended or adjusted under 35 U.S.C. 154(b) by 0 days.

(21) Appl. No.: 14/891,108

(22) PCT Filed: Apr. 29, 2014

(86) PCT No.: PCT/EP2014/001150
§ 371 (c)(1),
(2) Date: Nov. 13, 2015

(87) PCT Pub. No.: WO2014/183836
PCT Pub. Date: Nov. 20, 2014

(65) Prior Publication Data
US 2016/0120036 A1    Apr. 28, 2016

(30) Foreign Application Priority Data
May 16, 2013    (DE) .................. 10 2013 008 506

(51) Int. Cl.
*G06K 19/06*    (2006.01)
*H05K 1/18*    (2006.01)
(Continued)

(52) U.S. Cl.
CPC ....... *H05K 1/186* (2013.01); *G06K 19/07718* (2013.01); *G06K 19/07722* (2013.01);
(Continued)

(58) Field of Classification Search
CPC ............ G06K 19/07749; G07F 7/1008; G06Q 20/341
(Continued)

(56) References Cited

U.S. PATENT DOCUMENTS

| 8,408,473 | B2 | 4/2013 | Wagner et al. | |
| 8,770,488 | B2* | 7/2014 | Fischer | B26D 5/36 235/492 |

(Continued)

FOREIGN PATENT DOCUMENTS

| DE | 19854986 A1 | 5/2000 |
| DE | 102009014343 A1 | 9/2010 |

(Continued)

OTHER PUBLICATIONS

German Search Report for corresponding German Application No. 102013008506.3, dated Mar. 26, 2014.

(Continued)

*Primary Examiner* — Ahshik Kim
(74) *Attorney, Agent, or Firm* — Workman Nydegger

(57) ABSTRACT

A method for producing a portable data carrier includes a spatial structure printed on a first foil. Electroconductive lines are applied first, and components are subsequently inserted in the structure, wherein the structure corresponds to the dimensions or the shape and size of the inserted components. The components are electroconductively connected to the lines therein. A cover is printed over the components. A second foil can be applied to the cover, wherein a design print can be applied to both foils. A gap can be incorporated in the structure and the foils, in order to insert a chip module.

16 Claims, 3 Drawing Sheets

(51) Int. Cl.
  *G06K 19/077* (2006.01)
  *H05K 3/00* (2006.01)
  *H05K 3/10* (2006.01)
  *H05K 3/14* (2006.01)
  *H05K 3/20* (2006.01)
  *H05K 3/32* (2006.01)
(52) U.S. Cl.
  CPC . *G06K 19/07732* (2013.01); *G06K 19/07747* (2013.01); *H05K 3/0014* (2013.01); *H05K 3/0052* (2013.01); *H05K 3/10* (2013.01); *H05K 3/14* (2013.01); *H05K 3/202* (2013.01); *H05K 3/32* (2013.01); *H05K 2201/10007* (2013.01); *H05K 2201/10128* (2013.01); *H05K 2201/10151* (2013.01); *H05K 2203/033* (2013.01)
(58) Field of Classification Search
  USPC .................. 235/492, 451, 488; 340/10.1
  See application file for complete search history.

(56) References Cited

U.S. PATENT DOCUMENTS 8,955,755 B2* 2/2015 Heusmann ........... G06K 19/077
                                                  235/380
2007/0087564 A1* 4/2007 Speakman ........... H01G 9/2031
                                                  438/674
2009/0303011 A1* 12/2009 Ogata ............... G06K 19/07722
                                                  340/10.1
2011/0266351 A1 11/2011 Wagner et al.
2012/0066893 A1* 3/2012 Tarantino ......... G06K 19/07718
                                                  29/592.1
2015/0269473 A1* 9/2015 Ottobon ........... G06K 19/07754
                                                  235/492

FOREIGN PATENT DOCUMENTS

EP          1710021 A1    10/2006
WO       2010060755 A1    6/2010

OTHER PUBLICATIONS

International Preliminary Report on Patentability for corresponding International PCT Application No. PCT/EP2014/001150, dated Nov. 26, 2015.

International Search Report for corresponding International PCT Application No. PCT/EP2014/001150, dated Jul. 4, 2014.

* cited by examiner

METHOD FOR PRODUCING PORTABLE DATA CARRIERS

BACKGROUND

The invention describes a production method for portable data carriers.

Conventional portable data carriers, such as e.g. chip cards, credit cards, SIM cards, etc., are produced by means of an injection-molding or lamination method. Before starting the production of data carriers, machines, tools, utilized materials and components must be coordinated with each other. As a rule, this is very cost-intensive and time-consuming.

The great disadvantage is that the production method of portable data carriers cannot be adjusted flexibly to e.g. different electronic components, such as e.g. display elements, without having to effect a time-consuming and cost-intensive adaptation of tools and materials. Further, this makes fast response times to customer requirements or changes of the dimensions of components from suppliers impossible.

SUMMARY

It is therefore the object of the present invention to make available a production method for portable data carriers which makes possible a high flexibility and short response time with regard to changes in the production method, e.g. changed dimensions of components or changed customer requirements, at low costs.

To achieve this object, the invention discloses a method for producing a portable data carrier which is characterized in that at least one spatial structure is printed, wherein the shape and size of the at least one structure corresponds to at least one component to be inserted in the at least one structure. The advantage of the invention is that by means of a three-dimensional printing method, such as known e.g. from rapid prototyping, a structure can be printed that can be adjusted in fast, simple and cost-effective fashion to changed dimensions of a component or to changed customer requirements. The dimensions or shape and size of the components to be placed in the structure are captured electronically, and the structure is printed such that it fits correspondingly. This saves the hitherto time-consuming and cost-intensive effort for adjusting material and production machines for the fabrication of portable data carriers.

One advantageous embodiment of the invention is that the at least one structure is printed on at least one first foil. The advantage is that the structure can be processed further more easily when the structure is printed on a foil. Further, the foil offers the possibility to change an outer side of the data carrier by a design on the foil.

It is an advantageous embodiment of the invention that at least one conductive path is applied to the at least one structure, such that the at least one conductive path is connected electroconductively at least with one component to be inserted. Depending on the structure and the utilized component, the position of the conductive paths can thus be suitably adapted in flexible fashion. A prefabrication of conductive paths is consequently not necessary.

It is an advantageous embodiment of the invention that the at least one conductive path is produced by spraying on or casting. The spraying on or casting of conductive paths has the advantage that conductive paths can thus be laid in a very simple, cost-effective and flexible fashion.

It is an advantageous embodiment of the invention that before placing the at least one component into the at least one structure an adhesive is applied to the at least one structure and/or to the at least one component, in order to fixate the at least one component and/or in order to compensate an uneven area of the at least one structure and/or in order to electroconductively connect the at least one component to at least one conductive path.

It is an advantageous embodiment of the invention that the at least one component placed in the at least one structure is covered at least partially by means of a printed cover, such that an even outer surface of the data carrier results.

It is an advantageous embodiment of the invention that between the at least one component and the cover at least one hollow space is formed. A hollow space offers the possibility to install elements which require a certain space for operation, such as e.g. vibrating components.

It is an advantageous embodiment of the invention that at least one second foil is applied to the cover. Thus the outer sides on both sides of the portable data carrier can be supplied with a certain design on the foils.

It is an advantageous embodiment of the invention that an electronic component is placed as component in the at least one structure. As electronic component, for example a chip and/or an antenna coil and/or a contact area according to ISO 7810 and/or a sensor and/or an electronic display and/or a feeler is expedient, which is placed in the structure.

It is an advantageous embodiment of the invention that at least the first and/or at least the second foil are made available in the form of a foil sheet or of a foil web unwound from a roll. The processing of the foil in the form of a sheet or of a foil wound unto a roll is expedient in order to make efficient and fast fabrication possible, wherein the processing of the foil from the roll is substantially faster than the processing of the foil in sheet form.

It is an advantageous embodiment of the invention that into the at least one structure and/or into the at least first and/or into the at least second foil at least one gap is incorporated. The advantage of a gap is that for example the portable data carrier can be prefabricated and a gap that is suitable for a component to be inserted can be produced at a later time. The at least one gap is produced advantageously by means of a milling cutter and/or a die cutter and/or a laser and/or a water jet. The gap can for example have the shape of a chip module to be inserted in the gap.

It is an advantageous embodiment of the invention that at least the first and/or at least the second foil is printed. The advantage of printing the foils, for example during the unwinding of the foil, is that any designs can be applied to the foil, and always only such a number of designs is produced as currently needed. For very fast printing, a digital printing method is expedient, which is also suitable for the in-line production of portable data carriers.

It is an advantageous embodiment of the invention that at least the first foil and/or at least the second foil is light-transmissive or light non-transmissive. It is expedient to utilize light-transmissive foils for example for display cards, the display of which is protected towards the outside by a light-transmissive foil. It is expedient to utilize light non-transmissive foils for data carriers which contain for example electronic components which are not to be visible from the outside.

It is an advantageous embodiment of the invention that at least the first foil and/or at least the second foil comprises at least one foil layer. By different foil layers for example the mechanical properties of the portable data carrier can be influenced, such as e.g. elasticity. In so doing, suitable foil materials can be combined in order to achieve desired mechanical properties.

It is an advantageous embodiment of the invention that at least the first foil and/or at least the second foil is bonded with the cover by means of the adhesive. The bonding of the cover and the foil by means of adhesive makes it possible to connect the two components fast.

It is an advantageous embodiment of the invention that the adhesive is cured at room temperature. The advantage of an adhesive curing at room temperature is that no additional energy is required to cure the adhesive at an elevated temperature.

It is an advantageous embodiment of the invention that the adhesive is an electroconductive adhesive. An electroconductive adhesive has the advantage that it is possible to produce in one operation both a connection which can withstand a mechanical load and a connection which is electroconductive.

It is an advantageous embodiment of the invention that data carriers are punched out from the foil sheet or from the foil web. For punching, rotating die cutters can be utilized advantageously, which make possible a particularly high throughput of data carriers to be produced. These die cutters are suitable in particular for use in a so-called in-line production of portable data carriers, since here a foil is unwound from the roll and then all processing steps are carried out with the foil in the form of a web, until the finished data carriers are punched out from the processed foil in the end.

To achieve the object, the invention further describes portable data carriers produced according to the above-described method.

BRIEF DESCRIPTION OF THE DRAWINGS

In the following, exemplary embodiments of the invention will be described in detail with reference to the attached figures.

DETAILED DESCRIPTION OF VARIOUS EMBODIMENTS

Figure 1:
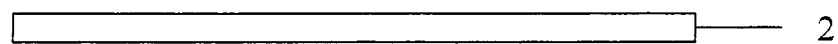
FIGS. 1 to 8 represent the individual steps for producing a portable data carrier according to the method of the invention.

At the start of the production of a portable data carrier, e.g. a chip card, a SIM card or a credit card, according to the method of the invention, in FIG. 1 a light-transmissive or a light non-transmissive foil 2 is made available in the form of a sheet or in the form of foil unwound from a roll. For example a light-transmissive foil 2 is utilized for display cards or a light non-transmissive foil 2 is utilized for cards with electronic components which are not to be visible from the outside. Alternatively, also a partly transparent foil can be utilized, e.g. a foil having light-transmissive and light non-transmissive stripes.

Figure 2:
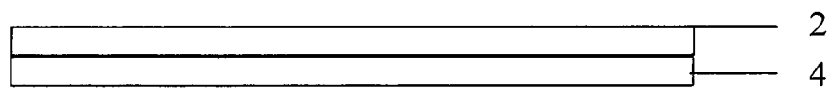

To at least one side of the foil 2 a design or an artwork or other print 4 is applied in FIG. 2. All suitable printing methods can be used for this purpose. For example, a digital printing method is suitable in particular for a so-called roll-to-roll method, meaning that at least one foil 2 is made available for the process from the roll. The foil 2 is unwound, fed to the process and for example wound up again after the processing, in order to further process the foil 2 or for example in order to punch out data carriers from the processed foil 2. The foil 2 can be printed by means of the digital printing method among other things during one passage through the process.

Figure 3:
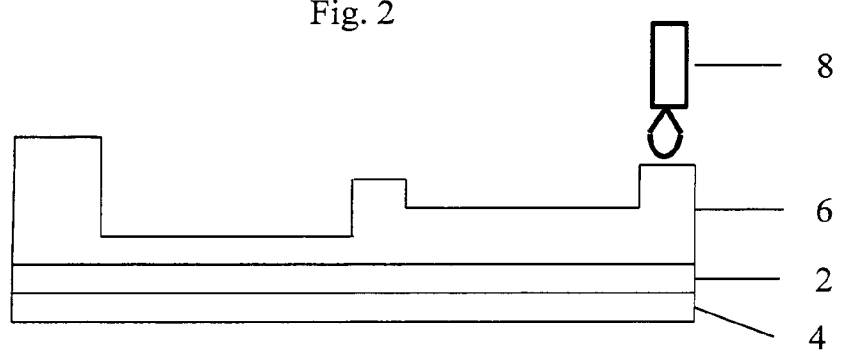

To the side of the foil 2 that lies opposite the print 4, in FIG. 3 a structure 6 is imprinted by means of a three-dimensional printer 8. As printer 8, any suitable printer can be utilized for creating three-dimensional structures. For example, for the present invention printers for a so-called rapid-prototyping process can be utilized. The structure 6 has the shape and size or the dimensions of components to be inserted in the structure 6 at a later time. The structure 6 can also be slightly larger than the component to be inserted.

Figure 4:
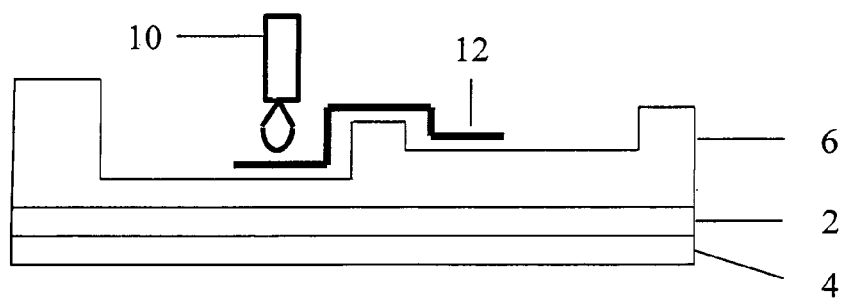

Before inserting components in the structure 6, in FIG. 4 at least one conductive path 12 is applied by means of a metering head 10. The conductive path 12 can for example be imprinted or sprayed on or cast on. The conductive path 12 is laid such that the conductive path 12 connects in corresponding electroconductive fashion corresponding contacts of components to be placed at a later time.

Figure 5:
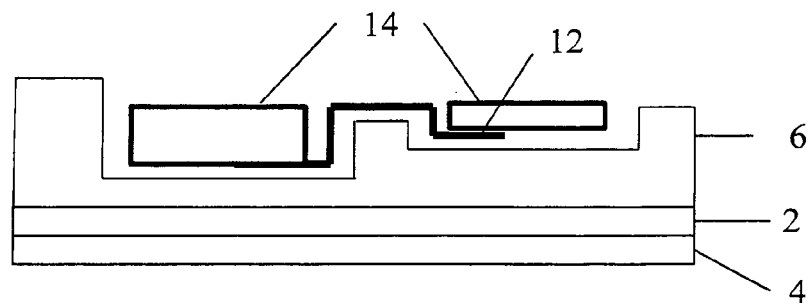

In FIG. 5 components 14 are placed in the structure 6 and possibly connected to the conductive path 12. Optionally, an adhesive can be applied to the component 14 or to the structure 6 in order to fixate the component 14 or in order to compensate uneven areas on the structure 6.

Figure 6:
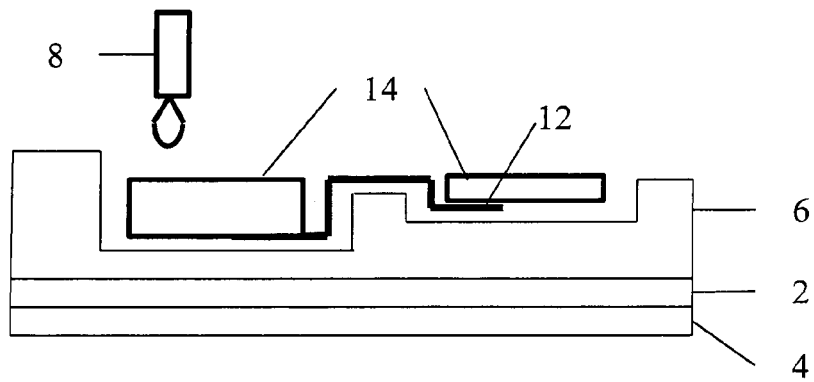
Figure 7:
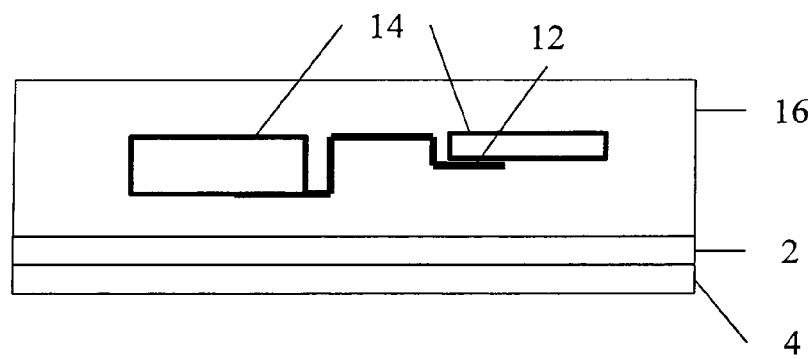

After inserting and connecting the components 14, a cover 16 is applied to the components 14 by means of the three-dimensional printer 8, as represented in the FIGS. 6 and 7. The components 14 are enclosed entirely for this purpose. Alternatively, also hollow spaces can result between the components 14 and the cover 16, in order to use the hollow spaces for a later function of the components 14, e.g. for a vibrating component.

Figure 8:
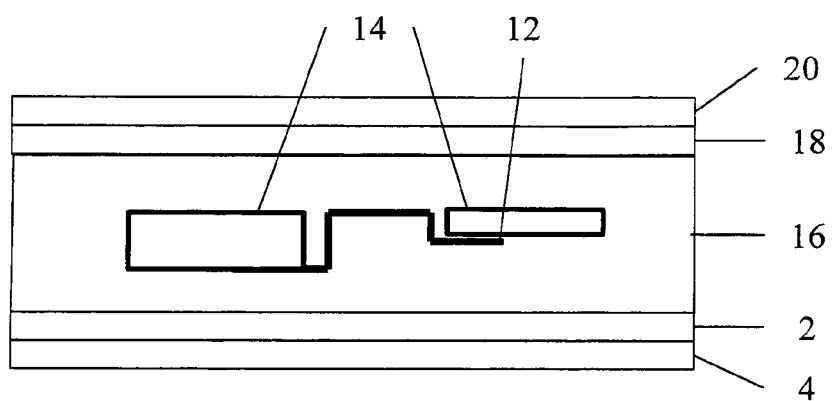

In FIG. 8 a foil 18 is applied to the cover 16. The foil 18 can have an imprint 20 on at least one side. The foil 18 itself can be attached to the cover 16 by means of an adhesive. The adhesive can be activatable by heat or be cured at room temperature.

In order to electroconductively connect a contact of a component to a conductive path 12, it is possible to use an electroconductive adhesive especially in the region of an electroconductive connection between the contact of a component and the conductive path 12.

When the foil 2 and/or 18 was processed in sheet form or web form, a finished portable data carrier, e.g. a SIM card, can be punched out from the created composite.

Figure 9:
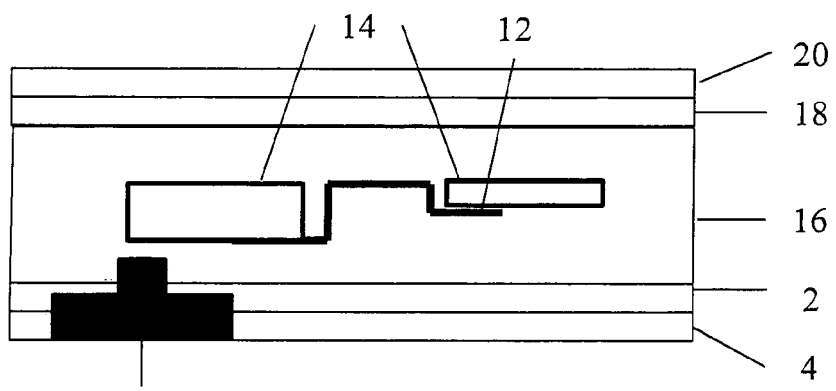
FIG. 9 represents an alternative embodiment with a module inserted from the outside.

FIG. 9 represents an alternative embodiment with a module 22 inserted from the outside. In this embodiment, a gap was provided in the foil 2 and in the imprint 4. The gap has a size such that a module 22, e.g. a chip module, is inserted from the outside, wherein the size of the gap can also be slightly larger than the module 22 to be inserted. In order to avoid a milling out of the structure 6 in order to create a gap for the module 22, the shape and/or the size of the module 22 can be left out upon printing the structure 6.

LIST OF REFERENCE NUMBERS 2 light-transmissive or light non-transmissive foil or a foil having both light-transmissive and light non-transmissive regions
4 design, artwork, imprint
6 printed structure
8 three-dimensional printer
10 metering head for applying a conductive path
12 conductive path 14 components inserted in the structure, e.g. electronic components
16 cover of the inserted components
18 light-transmissive or light non-transmissive foil or a foil having both light-transmissive and light non-transmissive regions
20 design, artwork, imprint
22 inserted module

The invention claimed is:

1. A method for producing a portable data carrier, wherein at least one spatial structure is three dimensionally printed, wherein the shape and the size of the at least one spatial structure corresponds to at least one component to be inserted in the at least one spatial structure, and
wherein the at least one spatial structure is printed on at least one first foil.

2. The method according to claim 1, further comprising at least one conductive path wherein the at least one conductive path is applied to the at least one spatial structure, such that the at least one conductive path is connected electroconductively at least with one component to be inserted.

3. The method according to claim 2, wherein the at least one conductive path is produced by spraying on or casting.

4. The method according to claim 1, wherein before placing the at least one component in the at least one spatial structure an adhesive is applied to the at least one spatial structure or to the at least one component, in order to fixate the at least one component or in order to compensate an uneven area of the at least one spatial structure or in order to electroconductively connect the at least one component with at least one conductive path.

5. The method according to claim 1, wherein the at least one component placed in the at least one spatial structure is covered at least partially by means of a printed cover, such that an even outer surface of the data carrier results.

6. The method according to claim 5, further comprising at least one second foil wherein the at least one second foil is applied to the cover.

7. The method according to claim 1, wherein an electronic component is placed as component in the at least one spatial structure.

8. The method according to claim 7, wherein as electronic component a chip or an antenna coil or a contact area according to ISO 7810 or a sensor or an electronic display or a feeler is placed.

9. The method according to claim 1, further comprising a first foil or a second foil wherein at least the first or at least the second foil is made available in the form of a foil sheet or in the form of a foil web unwound from a roll.

10. The method according to claim 1, further comprising at least one gap wherein the at least one gap is incorporated in the at least one spatial structure or in the at least first or in the at least second foil.

11. The method according to claim 10, wherein the at least one gap has the shape of a chip module to be inserted in the gap.

12. The method according to claim 1, wherein at least the first and/or at least the second foil is printed.

13. The method according to claim 1, wherein data carriers are punched out from the foil sheet or from the foil web.

14. A portable data carrier produced in a method according to claim 1.

15. A method for producing a portable data carrier, wherein at least one spatial structure is three dimensionally printed, wherein the shape and the size of the at least one spatial structure corresponds to at least one component to be inserted in the at least one spatial structure, wherein before placing the at least one component in the at least one spatial structure an adhesive is applied to the at least one spatial structure or to the at least one component, in order to fixate the at least one component or in order to compensate an uneven area of the at least one spatial structure or in order to electroconductively connect the at least one component with at least one conductive path.

16. A method for producing a portable data carrier, wherein at least one spatial structure is three dimensionally printed, wherein the shape and the size of the at least one spatial structure corresponds to at least one component to be inserted in the at least one spatial structure, wherein the at least one component placed in the at least one spatial structure is covered at least partially by means of a printed cover, such that an even outer surface of the data carrier results.

* * * * *